(12) United States Patent
Schaeffer

(10) Patent No.: US 6,446,021 B1
(45) Date of Patent: *Sep. 3, 2002

(54) METHOD AND APPARATUS TO DISPLAY PROCESSING PARAMETER

(75) Inventor: Ralph H. Schaeffer, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/032,621

(22) Filed: Feb. 27, 1998

(51) Int. Cl.[7] .............................................. G06F 19/00
(52) U.S. Cl. ........................ 702/118; 702/81; 702/84; 700/121
(58) Field of Search .................................. 702/118, 123, 702/81, 84; 700/121; 324/500, 765

(56) References Cited

U.S. PATENT DOCUMENTS

| | | | |
|---|---|---|---|
| 5,226,361 A | | 7/1993 | Grant et al. |
| 5,240,866 A | | 8/1993 | Friedman et al. ............... 437/8 |
| 5,241,266 A | | 8/1993 | Ahmad et al. ............... 324/158 |
| 5,457,400 A | | 10/1995 | Ahmad et al. ............... 324/763 |
| 5,483,175 A | | 1/1996 | Ahmad et al. ............... 324/766 |
| 5,511,005 A | * | 4/1996 | Abbe et al. ................... 364/552 |
| 5,526,293 A | * | 6/1996 | Mozumder et al. ......... 364/578 |
| 5,539,752 A | | 7/1996 | Berezin et al. ............. 371/22.1 |
| 5,544,256 A | | 8/1996 | Brecher et al. ............. 382/149 |
| 5,726,920 A | * | 3/1998 | Chen et al. ................. 364/579 |
| 5,761,064 A | * | 6/1998 | La et al. ................. 364/468.17 |
| 5,787,021 A | * | 7/1998 | Samaha ...................... 364/552 |
| 5,793,650 A | * | 8/1998 | Mirza .......................... 364/552 |
| 5,822,717 A | * | 10/1998 | Tsiang et al. ............... 702/108 |
| 5,841,713 A | * | 11/1998 | Maeda ....................... 365/201 |
| 5,841,893 A | * | 11/1998 | Ishikawa et al. ............ 382/145 |
| 5,844,850 A | * | 12/1998 | Tsutsui et al. ............... 365/200 |
| 5,859,964 A | * | 1/1999 | Wang et al. ............ 395/185.01 |
| 5,897,627 A | * | 4/1999 | Leivian et al. ................. 706/12 |
| 5,907,492 A | * | 5/1999 | Akram et al. .......... 364/468.28 |
| 5,933,350 A | * | 8/1999 | Fujimoto et al. ....... 364/468.28 |
| 5,940,300 A | * | 8/1999 | Ozaki ..................... 364/468.28 |
| 5,963,881 A | * | 10/1999 | Kahn et al. .................... 702/35 |
| 5,966,459 A | * | 10/1999 | Chen et al. .................. 382/149 |
| 5,985,497 A | * | 11/1999 | Phan et al. ..................... 430/30 |
| 5,991,699 A | * | 11/1999 | Kulkarni et al. ............... 702/83 |
| 5,996,415 A | * | 12/1999 | Stanke et al. .................. 73/597 |
| 6,009,545 A | * | 12/1999 | Tsutsui et al. ............... 714/718 |

OTHER PUBLICATIONS

Collica, "The Physical Mechanism of Defect Clustering and Its Correlation to Yield Model Parameters for Yield Improvement", IEEE, 1990.*

* cited by examiner

Primary Examiner—Patrick Assouad
(74) Attorney, Agent, or Firm—Schwegman, Lundberg, Woessner & Kluth, P.A.

(57) ABSTRACT

A system and method that provides various forms of graphic representations of test results of manufacturing process runs which can readily be shared with multiple users of the system is disclosed. A method for reporting a test process of a plurality of cells, wherein the test process is performed in a series of runs is disclosed. The method includes four steps. First, data regarding the test process for the plurality of cells is gathered. The data is accumulated over the series of runs. Next, the data is characterized to create a set of selected information. The set of selected information includes a subset of the data regarding the test process for the plurality of cells. The method also includes the steps of generating a user-consumable output of the set of selected information, and providing access to the data, the set of selected information, and the user-consumable output. The step of generating a user consumable output includes generating a map or generating a graph.

22 Claims, 6 Drawing Sheets

METHOD AND APPARATUS TO DISPLAY PROCESSING PARAMETER

FIELD OF THE INVENTION

The present invention relates to integrated circuit devices. More particularly, the present invention relates to a method and apparatus for monitoring, over a period of time, the quality of integrated circuit devices during manufacture.

BACKGROUND

Integrated circuit chips are manufactured through a complex process involving a great number of operations through which various conductive and insulating materials are layered and etched according to intricate patterns. In conventional processing, integrated circuits are not manufactured individually, but rather an arrangement of a hundred or more chips is manufactured on a semiconductor wafer. The individual chips are then separated once the other processing is complete. Defects can be introduced at any stage in the manufacturing process. A large percentage of defects result from dust or other foreign matter introduced during deposition or printing steps, or from scratches or other imperfections introduced at some point during the process. Errors may also be introduced by deficiencies in the processing from such sources as faulty equipment or faulty process steps.

The number and severity of defects have a direct effect on the yield from any one wafer and from the overall production run. With the demand for integrated circuit chips always increasing, there continues to be a need for maximizing production yield. It is also important to be able to accurately estimate the yield from any one production run in order to accurately gauge wafer starts in order to avoid wasting materials. Both efforts are directed to making the integrated circuit chip manufacturing process as efficient as possible.

Initially wafers were scanned manually to identify and attempt to correct defects. As scanning technology advanced, manufacturers began developing automated methods for evaluating the circuitry constructed in the wafers. Initial efforts were directed toward detecting and classifying defects. For example, in U.S. Pat. No. 5,240,866 Friedman et al. describe a method for distinguishing random defects from defects introduced at one of the process steps. Friedman et al. focuses on grouping defects on a given wafer in an effort to determine whether there is a relationship between defects and process steps. The solution proposed by Friedman et al. presupposes that a grouping ("cluster") of defects can be used to identify weaknesses in the manufacturing process. Attempts are made to identify patterns by mapping failed circuits for a series of wafers, and then analyzing the result to determine if there is a pattern ("spatial cluster") indicating a process problem. The process analyzes the results and creates a cluster analysis report or a notification of a match (group of wafers with same process step having the same defect cluster).

In U.S. Pat. No. 5,539,753, Berezin et al. describes a method for sampling and pre-classifying wafer defects in an effort to identify situations where the defect density or number of defects per die exceeds a predefined threshold. Brecher et al., in U.S. Pat. No. 5,544,256, describes a similar attempt to improve defect classification. These and other conventional defect analysis methods are designed to provide a more systematic method of choosing a statistically meaningful group of defects, in an attempt to achieve a more accurate sampling of wafers and make the manual part of inspection more efficient and effective.

Notwithstanding the above, there remains a need for a system to provide various forms of graphic representations of test results of manufacturing process runs which can readily be shared with multiple users of the system.

SUMMARY OF THE INVENTION

The system and method of the present invention provides various forms of graphic representations of test results of manufacturing process runs which can readily be shared with multiple users of the system. One aspect of the invention is a method for reporting a test process of a plurality of cells, wherein the test process is performed in a series of runs. The method includes four steps. First, data regarding the test process for the plurality of cells is gathered. The data is accumulated over the series of runs. Next, the data is characterized to create a set of selected information. The set of selected information includes a subset of the data regarding the test process for the plurality of cells. The method also includes the steps of generating a user-consumable output of the set of selected information, and providing access to the data, the set of selected information, and the user-consumable output. The step of generating a user consumable output includes generating a map or generating a graph.

Another aspect of the present invention is a readable medium having a plurality of modules stored thereon, such as a piece of software. The modules are capable of causing an information handling system, such as a computer network to operate in a particular manner. The plurality of modules include a data gather module, a characterization module, an output module, and a distribution module. The data gather module gathers data regarding at least one test process of a plurality of cells. The characterization module creates a selected set of information including a subset of the data. The output module generates a user-consumable output of the selected set of information. The distribution module provides access to the data, selected set of information, and the user-consumable output to users of the computer network. In another aspect of the invention, the modules are operable with a selected software application such as an Internet browser for providing access to the data, selected set of information, and the user-consumable output.

Still another aspect of the present invention is an information handling system which includes a probe suitable for use with a test process on a plurality of cells, a central processing unit having a memory, and suitable for receiving signals from the probe; and a plurality of modules in an operating environment for use with the central processing unit and operating on the signals. The modules are described above. The central processing unit is connected to a network and is accessible from a number of stations connected to the network. The information handling system also includes at least one of printer or a display for accessing the user-consumable output.

The present invention includes several advantages. Among these advantages include system to provide operators with processing information output in a format that is flexible and which can be easily shared, accessed, and understood. The outputs generated with the present invention include information that tracks both corrections made to the process as well as identifying where the usable chips are found on a wafer. Additionally, the outputs allow a user to track unclassified errors, or a series of process runs.

DETAILED DESCRIPTION OF THE PREFERRED EMBODIMENTS

Figure 1:
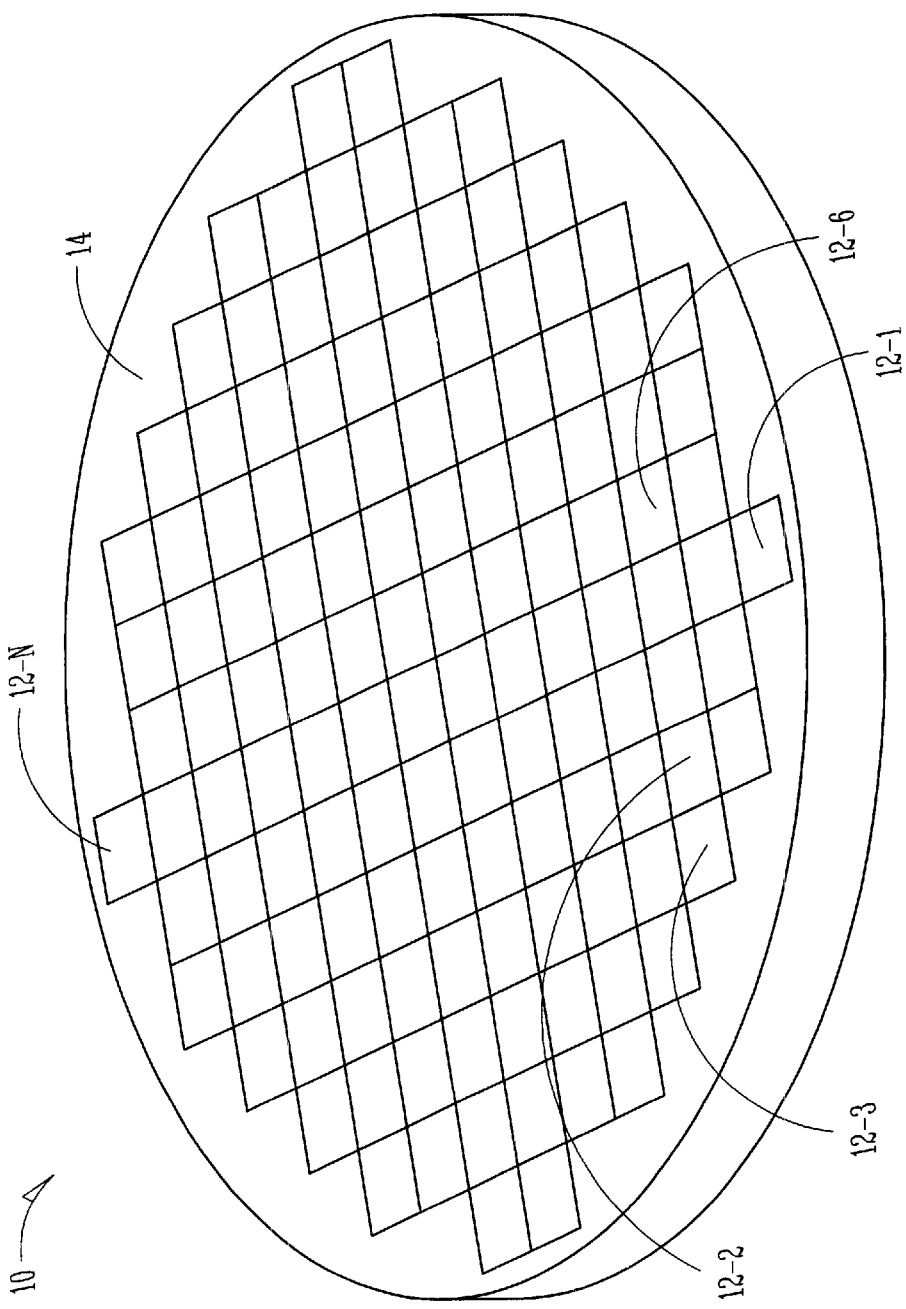
FIG. 1 shows a schematic view of a semiconductor wafer.

In the following detailed description, reference is made to the accompanying drawings which form a part hereof, and in which is shown, by way of illustration, specific embodiments in which the invention may be practiced. In the drawings, like numerals describe substantially similar components throughout the several views. The embodiments are described in sufficient detail to enable those skilled in the art to practice the invention. Other embodiments may be used and logical, structural, and electrical changes may be made without departing from the scope of the present invention.

The terms wafer and substrate used in the following description include any semiconductor-based structure having an exposed surface with which to form the integrated circuit structure of the invention. Wafer and substrate are used interchangeably to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The following detailed description is, therefore, not to be taken in a limiting sense, and the scope of the present invention is defined only by the appended claims and their equivalents.

FIG. 1 shows a perspective view of a semiconductor wafer 10 which has been processed to create a semiconductor devices 12-1 to 12-n in and on the wafer surface 14. A polished starting wafer comes into fabrication with blank surfaces and is completed with the surface covered with hundreds of finished chips. The manufacture of a semiconductor circuit often requires hundreds of individual steps. Typically, however, wafer fabrication involves four basic operations including layering, patterning, doping and heat treatments. Layering is the operation used to add thin layers to the wafer surface, either by growing or deposition. Patterning is the series of steps that results in the removal of portions of the added surface layers, and the process is known by the names of photomasking, masking, photolithography, and microlithography. Doping is the process that puts specific amounts of dopants in the wafer surface through openings in the surface layers, and includes the techniques of thermal diffusion or ion implantation. Finally, heat treatments are the operations in which the wafer is simply heated and cooled to achieve desired results. After fabrication, the wafer 10 is tested for defects.

Figure 2:
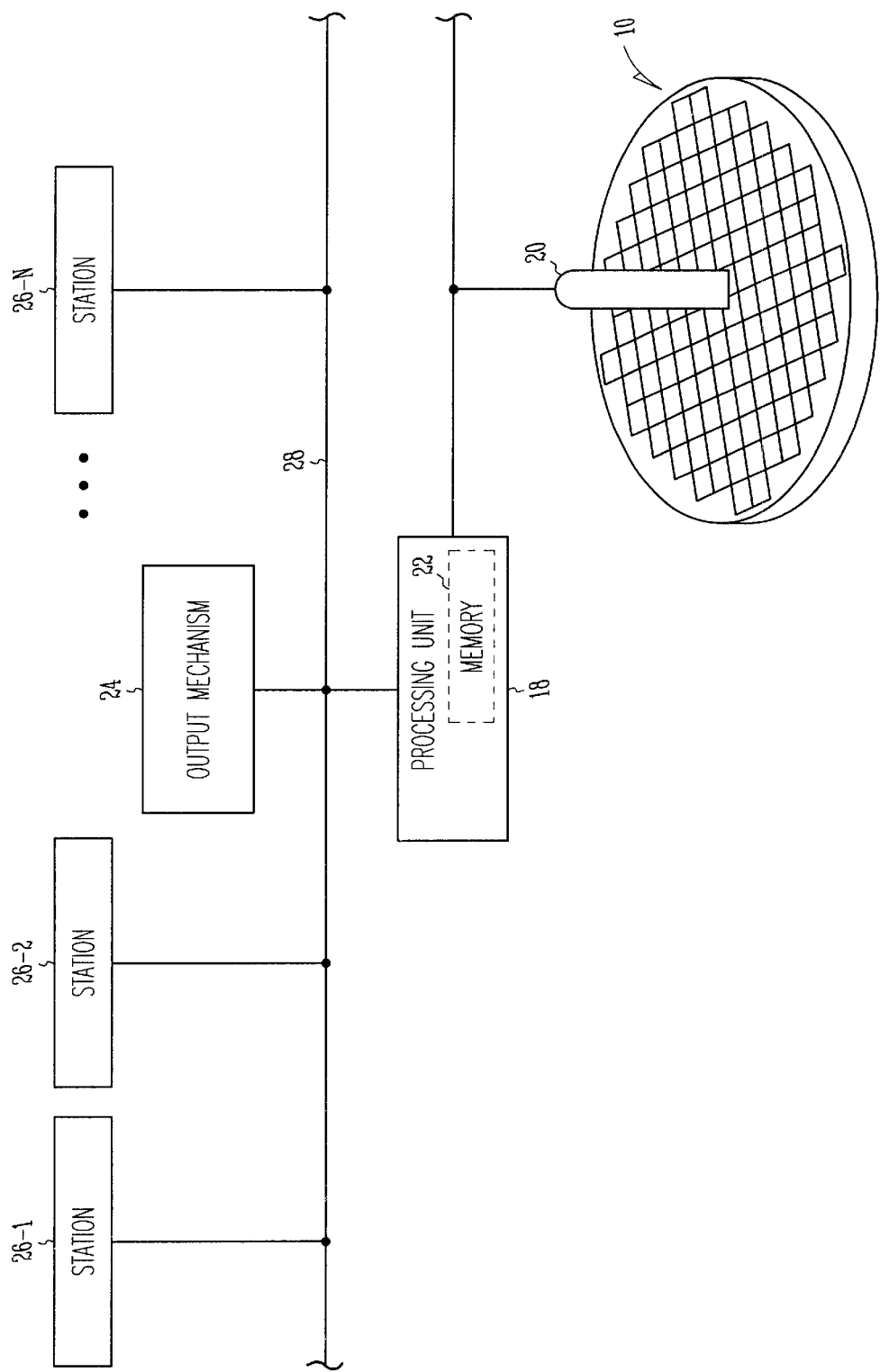
FIG. 2 shows a schematic diagram illustrating generally a system embodying features of the present invention and suitable for use with the wafer of FIG. 1.

FIG. 2 shows a schematic diagram of a testing device 16 constructed in accordance with the present invention. The device 16 is suitable for use on wafer 10, and includes a processing unit 18 such a computer coupled to a probe 20, or the like. The processing unit 18 includes a memory 22, and is also coupled to an output mechanism 24 such as a display or printer. In operation, the probe 20 accesses the wafer 10 so as to make contact with the devices 12-1–12-n. Through the probe 20, the testing device 16 provides electrical signals to the devices 12-1–12-n and recovers signals from the devices 12-1–12-n to test their operability. The signals are translated into data, which is provided to the processing unit 18. The processing unit 18 operates on the data and provides a user-consumable output to mechanism 24. In one embodiment, the processing unit 18 is a server which can be accessed by several users with stations 26-1–26-n connected together over a network 28.

Figure 3:
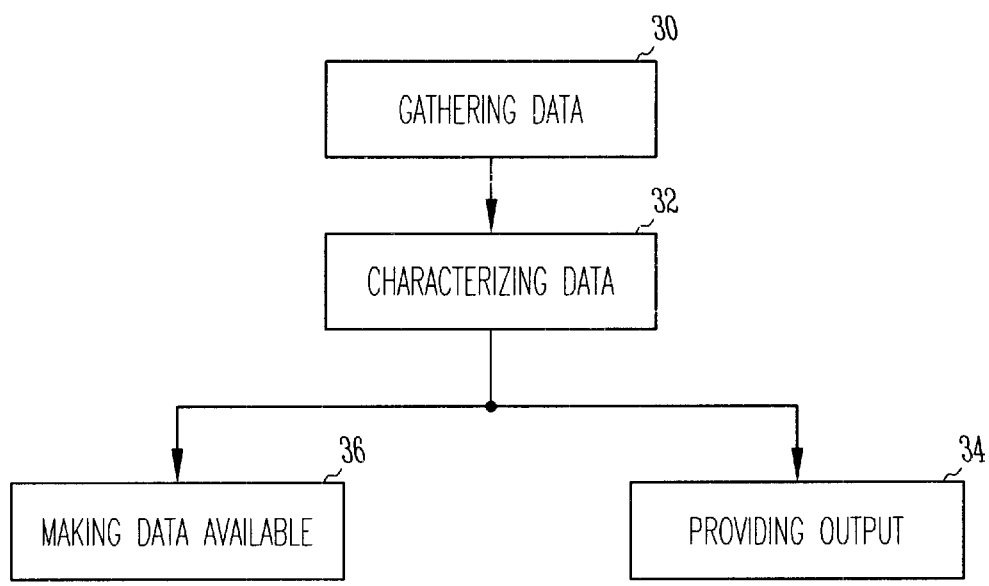
FIG. 3 shows a process flow-chart embodying features of the present invention and suitable for use with the system of FIG. 2.

FIG. 3 is a flow chart showing steps embodying features of the present invention and suitable for implementation on the device of FIG. 2. Specifically, FIG. 3 shows a general overview of the method of gathering and analyzing data 30, characterizing the data 32, providing a consumable output 34, and making it available over the intranet 36. Data is typically gathered a the testing stage of the fabrication process. The data is characterized in a manner known the industry the output can be created and output locally, created locally and accessed over the intranet, or created and accessed by users connected to the system. The consumable output can be a two dimensional chart or graph, or other type of visual presentation, indicating a selected manufacturing process run or a series of manufacturing process runs. In one embodiment, the method is implemented as a software application capable of causing system 16 to operate in a particular manner. This software includes a series of modules for performing the major components of this method.

Figure 4:
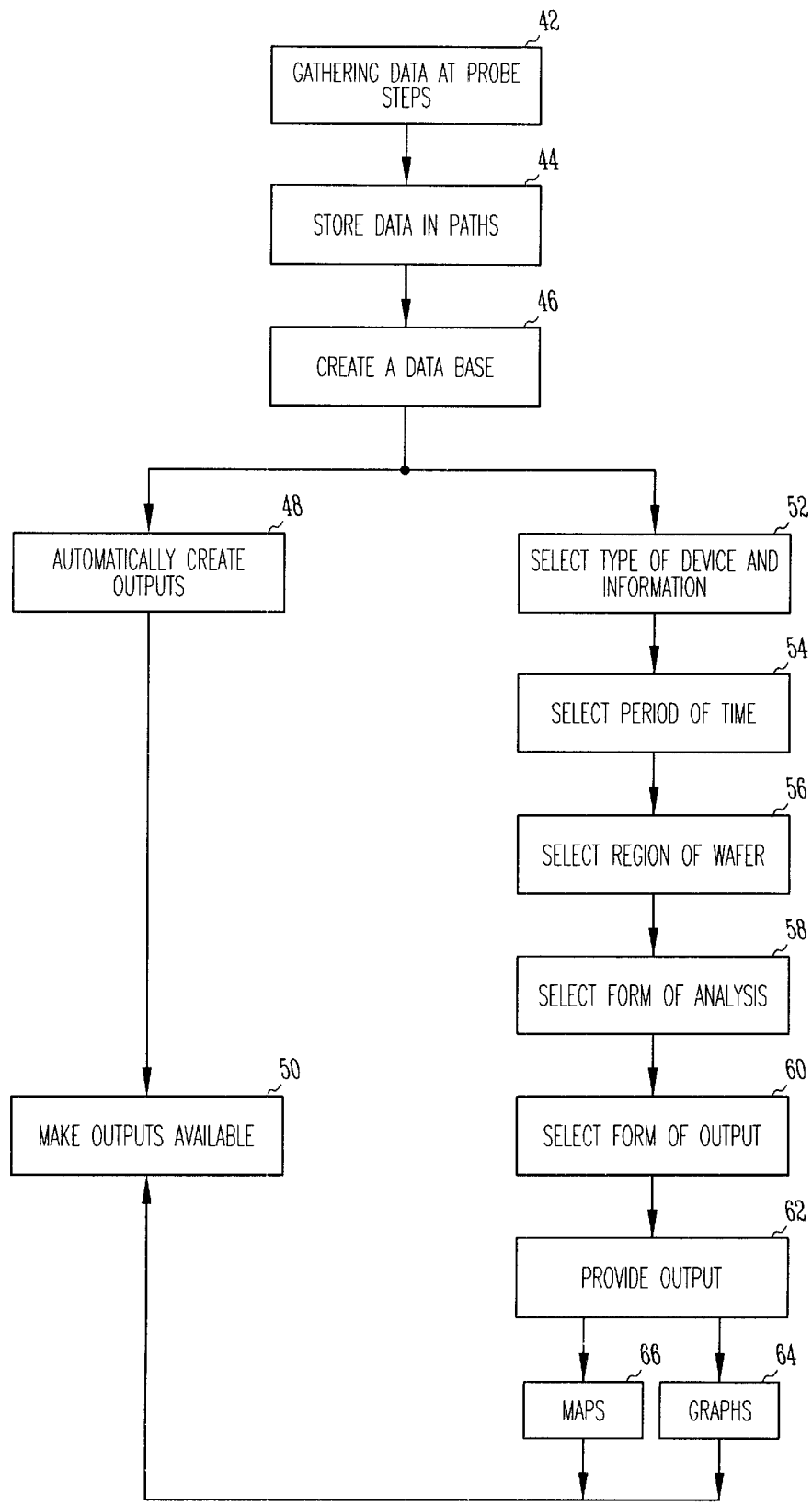
FIG. 4 shows another process flow-chart embodying features of the present invention and suitable for use with the system of FIG. 2.

FIG. 4 is a flow chart illustrating in more detail the steps of FIG. 3. As shown in the figure, data is gathered at the probe steps 42 of a testing process. Data is gathered from time to time, and the gathered data is stored on the system in paths specific to when the data was gathered 44, and is typically unique for each wafer tested. For example, the data can be stored in paths corresponding to wafers, or wafers generated over a period of time such as a week. The data can then be analyzed to compare wafers manufactured during a single run, or to compare a number of wafers manufactured during a first period of time with a number of wafers manufactured during a second period of time, or the like.

Within the paths, data is stored in a relational data base 46. For example, the data can be stored so that each cell in the wafer corresponds with a set of information. Such information can include column and row usage and repair histories. The information can also include bin and lot information, now known in the art. Such information can be used to give an indication of how product yields are distributed or whether problems exist with fabrications or probe equipment.

Information is automatically gathered over periods in time, and characterized in a pre-determined manner over those periods of time. Further, the data can be fashioned automatically in user-consumable outputs 48, such as a variety of graphs or maps as pre-defined to operate on the data, and made available to those connected to the system 50. Additionally, the characterized information itself can be made available to those connected to the system, and can be accessed to create a selected form of output. For example, the user can select a type of device to be analyzed, and the type of information regarding that device 52. Next, the user can select a period of time for the analysis of the selected part 54. Additionally, the user can select the region of the wafer to be analyzed 56, which can include the entire wafer, if desired. Next, the user selects the form of the analysis 58, whether it be cell by cell, row by row, column by column, or the like. Next, the user selects the form of the output 60. In one embodiment, the user provides this information to the system in a series of prompts and menu selections.

Once the user has provided the system with criteria regarding the selected form of the analysis and form of output, the system provides such an output 62. Two forms of an output, whether it is created automatically or based on user-selected criteria, include graphs 64 and maps 66. These outputs, in one embodiment, are made available for display to those connected to the system with "Internet browser" software applications such as "Netscape Navigator" by Netscape Communications Corporation of Mountain View, Calif.

Figure 5:
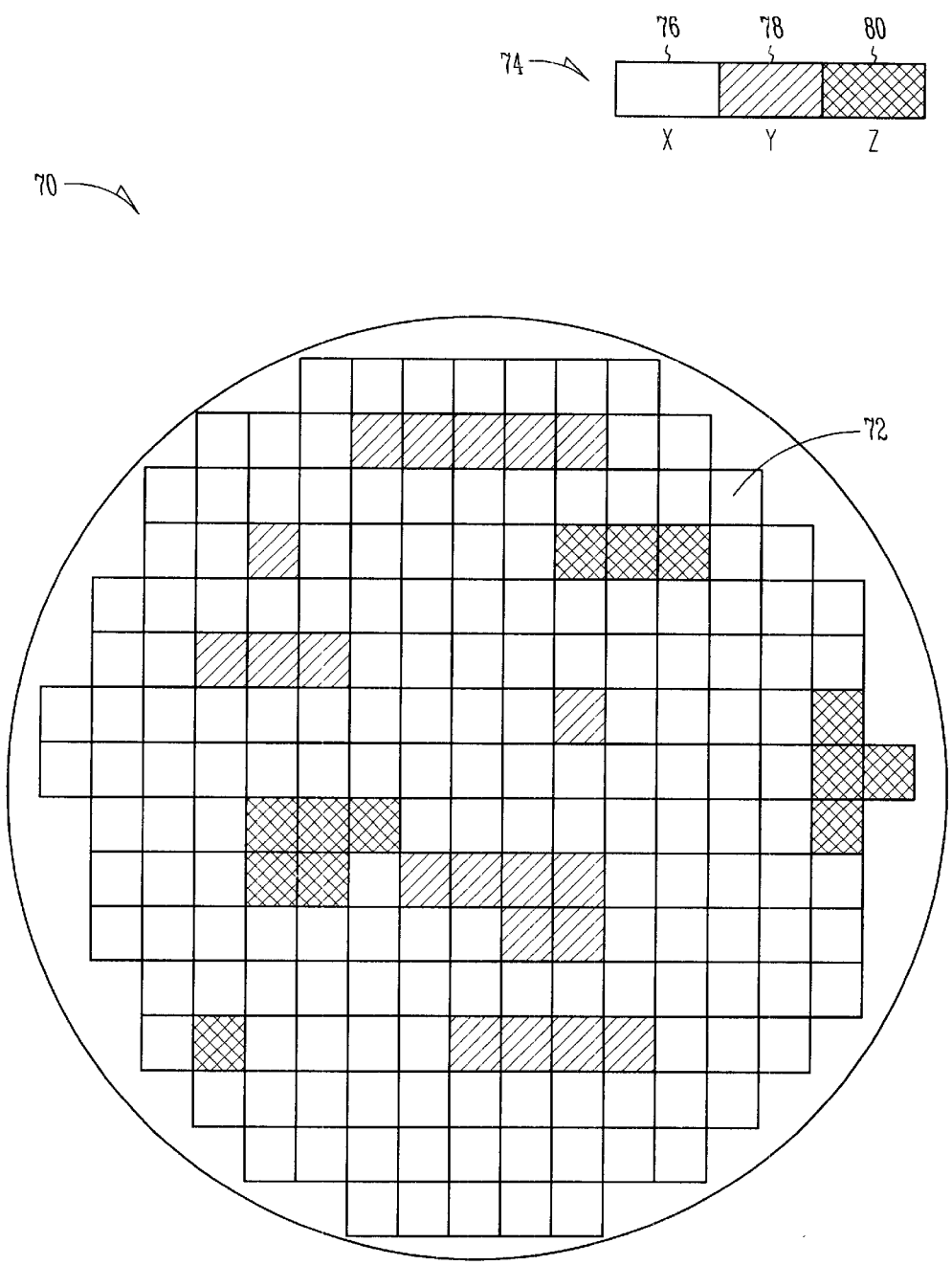
FIG. 5 shows a schematic diagram of a output created in accordance with the process flow-chart of FIG. 4.

FIG. 5 shows one example of a cell usage map 70 created with the method shown and described above. A wafer shape including cells 72 is superimposed on a graph to identify cell usage for a series of process runs. The map 70 also includes a legend 74. In the example shown, the legend indicates that cell usage is separated into three groups, i.e., group X 76, group Y 78, and group Z 80, representing ranges of cell usage values. The number of different ranges and the type of information included in each range is pre-selected and can be modified. Each cell 72 is identified by the number of the pattern constructed in that particular cell. The user can generate such maps for various process runs, and compare the cell usage ranges. With the map, problem areas within the wafer, such as lower than expected yield, or the effects of changes made to the process runs can readily be identified and additional analysis can be performed to maximize manufacturing efficiency.

Figure 6:
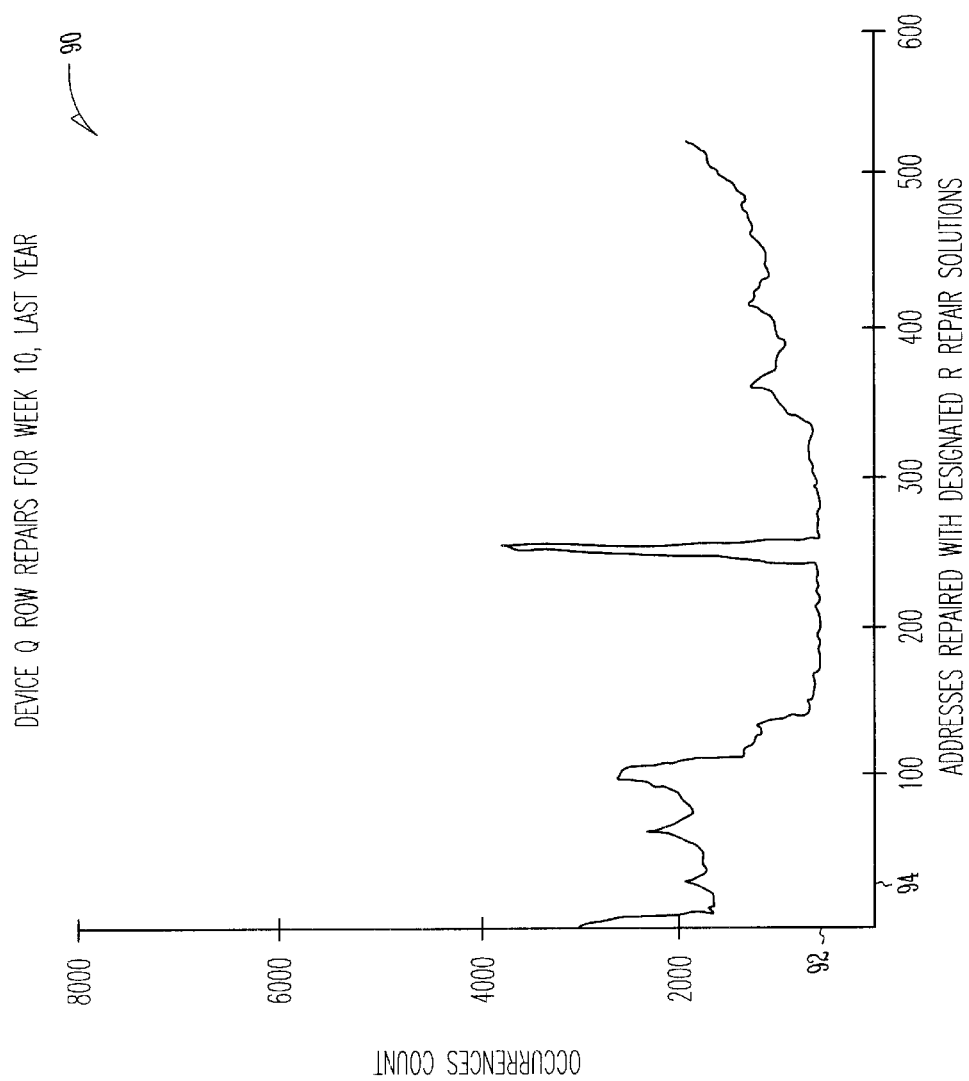
FIG. 6 shows a schematic diagram of another output created in accordance with the process flow-chart of FIG. 4.

FIG. 6 shows a graph 90 generated by the method shown and described above. Graph 90 indicates occurrences of a given repair solution 92 over addresses on a wafer 94. Repair solutions are another type of information that can be gathered and characterized with the methods shown in FIGS. 3 and 4. With this information, a user can detect areas of concern for a given process run or series of process runs. With a graph, the user can readily detect problem addresses or areas providing lower than expected yield. If a number of graphs are created, the user can determine the effect of changes made to the process runs, or the like.

It is to be understood that the above description is intended to be illustrative, and not restrictive. Many other embodiments will be apparent to those of skill in the art upon reviewing the above description. The invention should, therefore, be determined with reference to the appended claims, along with the full scope to which such claims are entitled.

What is claimed is:

1. A method reporting the results of a test process of a plurality cells arranged on wafers, the method comprising:
   probing the cells and gathering data;
   storing the data on a computer system in at least one of a path corresponding to at least one particular wafer and a path corresponding to a sub set of a series of runs;
   arranging stored data relative to each cell for display in a location on a map corresponding to the wafer location of that cell; and
   aggregating the stored data for a plurality of wafers for display on the map showing the aggregate cell usage for various cell positions.

2. A computer-executable medium having a plurality of modules stored thereon capable of causing an information handling system to operate in a particular manner, the plurality of modules comprising:
   a data gathering module for gathering probe data regarding at least one test process of cells arranged on multiple wafers;
   a characterization module for creating a selected set of information including a subset of the data relating to the usage of cells at specific wafer locations;
   an output module for generating a graphical output representative of the selected set of information, the graphical output comprising a map showing the cell usage value ranges relating to each of the cells on a map showing the wafer location of the cells.

3. An information handling system, comprising:
   a probe suitable for use with a test process on a plurality of cells, each of which is arranged on one of a plurality of wafers;
   a central processing unit having a memory, the central processing unit operatively coupled to receive signals from the probe indicative of the results of the test process; and
   a plurality of modules operatively coupled to the central processing unit for operating on the signals, the modules comprising:
      a data gathering module for gathering data regarding at least one test process of the plurality of cells;
      a characterization module for creating a selected set of information including a subset of the data;
      an output module for generating a graphical display output of the selected set of information; and
      a distribution module for providing access to the data, selected set of information, and the graphical display output.

4. The information handling system of claim 3 wherein the graphical display output is a map of the placement of the cells on the wafer which shows, for each cell position selected information concerning the test results for cells at that wafer location.

5. The information handling system of claim 3 wherein the graphical display output is a graph showing the incidences of a given repair solution over addresses on a wafer.

6. The computer executable medium of claim 2 wherein the modules are executable on a computer network.

7. The information handling system of claim 3 wherein the central processing unit is connected to a network and is accessible from a number of stations connected to the network.

8. The method of claim 1 where the data is collected during a testing phase following cell fabrication.

9. The method of claim 1 where the aggregating operation includes stored data from each run of a series of manufacturing process runs.

10. The method of claim 2 wherein the map compares a number of wafers manufactured during a first period of time with a number of wafers manufactured during a second period of time.

11. The method of claim 2, wherein the data regarding the at least one test process of cells is separated into groups representing ranges of cell usage values.

12. A method reporting the results of a test process performed on a plurality of cells arranged on wafers over a series of manufacturing process runs, the method comprising:
   probing each of the cells and gathering data regarding the performance of that cell;
   storing the performance data on a computer system in at least one of a path corresponding to at least one particular wafer and a path corresponding to a series of manufacturing runs;
   arranging stored data relative to each cell for graphical display on a map at a location corresponding to the wafer location of that cell; and
   aggregating the stored data for a plurality of wafers for graphical display on the map thereby showing aggregate cell usage for each cell position for a series of manufacturing runs.

13. The method of claim 12 where the data is collected during a testing phase following cell fabrication.

14. The method of claim 12 where the aggregating operation includes stored data from each run of a series of manufacturing process runs.

15. A computer-executable medium having a plurality of modules stored thereon capable of causing an information handling system to operate in a particular manner, the plurality of modules comprising:

a data gathering module for gathering probe data regarding at least one test process performed on a plurality of cells arranged on multiple wafers;

a characterization module for creating a selected set of information including a subset of the data relating to the usage of cells at specific wafer locations;

an output module for generating a graphical output representative of the selected set of information, the graphical output comprising a plot showing the cell usage value ranges relating to each of the plurality of cells on a plot showing the wafer location of the cells.

16. The method of claim 15, wherein the plot compares a number of wafers manufactured during a first period of time with a number of wafers manufactured during a second period of time.

17. The method of claim 15, wherein the data regarding the at least one test process of cells is separated into groups representing ranges of cell usage values.

18. An information handling system, comprising:

a probe suitable for use with a test process on a plurality of cells, each of which is arranged on one of a plurality of wafers;

a central processing unit having a memory, the central processing unit operatively coupled to receive signals from the probe indicative of the results of each of the test processes; and a plurality of modules operatively coupled to the central processing unit for operating on the signals, the modules comprising:

a data gathering module for gathering data regarding at least one test process of the plurality of cells;

a characterization module for creating a selected set of information including a subset of the data;

an output module for generating a graphical display output of the selected set of information; and a distribution module for providing access to the data, the selected set of information, and the graphical display output.

19. The information handling system of claim 18 wherein the graphical display output is a map of the placement of the cells on the wafer which shows, for each cell position selected information concerning the test results for cells at that wafer location for the plurality of wafers.

20. The information handling system of claim 18 wherein the graphical display output is a graph showing the incidences of a given repair solution over addresses on a wafer.

21. The computer executable medium of claim 18 wherein the modules are executable on a computer network.

22. The information handling system of claim 18 wherein the central processing unit is connected to a network and is accessible from a number of stations connected to the network.

* * * * *